United States Patent
Shen et al.

(10) Patent No.: US 8,835,295 B2
(45) Date of Patent: Sep. 16, 2014

(54) SPLIT GATE MEMORY DEVICE WITH GAP SPACER

(71) Applicants: Jinmiao J. Shen, Austin, TX (US); Ko-Min Chang, Austin, TX (US); Brian A. Winstead, Austin, TX (US)

(72) Inventors: Jinmiao J. Shen, Austin, TX (US); Ko-Min Chang, Austin, TX (US); Brian A. Winstead, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 32 days.

(21) Appl. No.: 13/961,574

(22) Filed: Aug. 7, 2013

(65) Prior Publication Data

US 2013/0323922 A1 Dec. 5, 2013

Related U.S. Application Data

(63) Continuation of application No. 13/248,549, filed on Sep. 29, 2011, now abandoned.

(51) Int. Cl.
*H01L 29/423* (2006.01)

(52) U.S. Cl.
USPC .......................................... 438/591; 438/596

(58) Field of Classification Search
USPC .................................................. 438/596, 591
See application file for complete search history.

(56) References Cited

U.S. PATENT DOCUMENTS

| 7,361,543 B2 * | 4/2008 | Steimle et al. ................. 438/201 |
| 7,811,886 B2 | 10/2010 | Winstead et al. |
| 2002/0197790 A1 * | 12/2002 | Kizilyalli et al. ............. 438/240 |
| 2009/0042349 A1 | 2/2009 | Prinz et al. |
| 2009/0108325 A1 * | 4/2009 | Kang et al. ..................... 257/316 |

OTHER PUBLICATIONS

Slotboom et al.; "Gate Isolation Technology for Compact Poly-CMP Embedded Flash Memories"; 33rd Conference on European Solid State Device Research; 2003; pp. 159-162; IEEE.

* cited by examiner

*Primary Examiner* — Zandra Smith
*Assistant Examiner* — Damian A Hillman
(74) *Attorney, Agent, or Firm* — David G. Dolezal (57) ABSTRACT

A method for forming a split gate device includes forming a first sidewall of a first conductive gate layer, wherein the semiconductor layer includes a tunnel region laterally adjacent the first sidewall, forming a dielectric layer along the first sidewall to provide for increased thickness of a gap spacer, forming a charge storage layer over a portion of a top surface of the first conductive layer and over the tunnel region, and forming a second conductive gate layer over the charge storage layer.

20 Claims, 6 Drawing Sheets

SPLIT GATE MEMORY DEVICE WITH GAP SPACER

CONTINUATION INFORMATION

This application is a continuation application of a U.S. patent application entitled "Split Gate Memory With Gap Spacer," having a Ser No. of 13/248,549, having a filing date of Sep. 29, 2011, all of which is incorporated by reference in its entirety.

BACKGROUND OF THE INVENTION

1. Field of the Invention

This invention relates to a split gate memory devices and more specifically to gap spacers for a spilt gate memory device.

2. Description of the Related Art

Split gate memory devices are memory device that include transistors having split gates. In one embodiment, a spilt gate transistor includes a control gate and a select gate. Charge is selectively introduced into a charge storage structure of a split gate transistor to store a value (e.g. a "1") where the lack of charge in the structure is indicative that another value (e.g. a "0") is stored.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that providing a split gate memory cell with a gap spacer between the select gate and control gate may advantageously provide for reduced program disturb and reduced select gate/control gate breakdown in a split gate memory cell.

FIGS. 1-6 set forth partial cross sectional side views of various stages of a wafer in the manufacture of a memory cell with a gap spacer formed by the oxidation of an oxidizable material.

Figure 1:
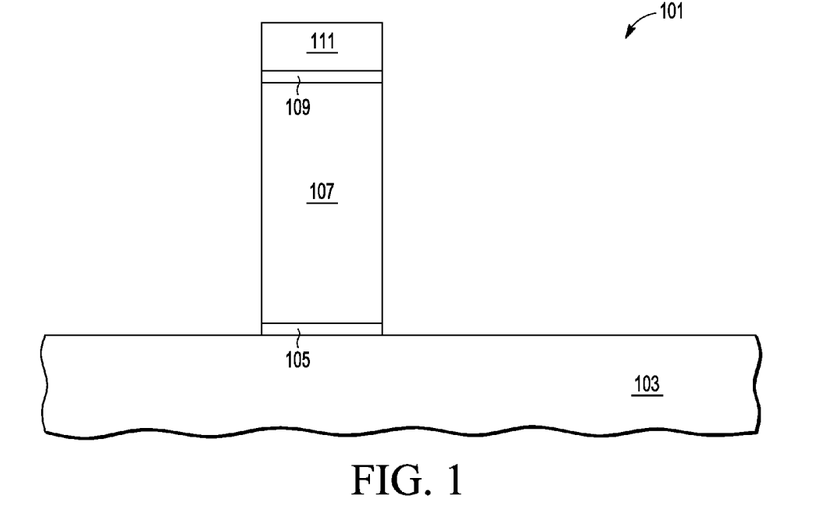
FIGS. 1-6 set forth partial cutaway side views of a memory cell at various stages in its manufacture according to one embodiment of the present invention.

As shown in FIG. 1, wafer 101 includes a semiconductor substrate 103. In one embodiment, substrate 103 is made of single crystal silicon and may be doped with impurities. In other embodiments, substrate 103 may be made of other types of semiconductor materials e.g. silicon germanium, silicon carbon, or a III-V semiconductor material. In one embodiment, substrate 103 is made of a bulk semiconductor material (e.g. a bulk substrate semiconductor layer), but may have other configurations in other embodiments (e.g. a semiconductor on insulator configuration). With a semiconductor on insulator configuration, a semiconductor layer is located on a buried dielectric layer.

A select gate 107 is formed over substrate 103. In one embodiment, gate 107 is made of doped polysilicon, but may be made of other gate materials in other embodiments. In one embodiment, gate 107 has a thickness (e.g. height in the view of FIG. 1) of 1500 Angstroms (A) but may have other thicknesses in other embodiments. A gate dielectric 105 is located between gate 107 and substrate 103. Gate dielectric 105 has a thickness in the range of 40-80 A, but may be of other thicknesses in other embodiments. Gate dielectric 105 is of a dielectric material such as e.g. silicon oxide, hafnium oxide, or other type of high K dielectric material.

Located on top of gate 107 is a dielectric structure 109. In one embodiment, dielectric structure 109 is made of silicon dioxide, but may be made of other materials in other embodiments. In one embodiment, structure 109 has a thickness in the range of 10-100 A, but may have other thicknesses in other embodiments. A structure 111 of an antireflective coating (ARC) is located on structure 109. In one embodiment, structure 111 is 200 A is thick but may be of other thicknesses in other embodiments. In one embodiment, structure 111 is made of silicon rich silicon nitride, but may be made of other materials in other embodiments. Some embodiments do not include structure 109 wherein structure 111 is located on gate 107.

The stack of dielectric 105, gate 107, structure 109, and structure 111 are formed by forming layers of those materials over substrate 103 and then patterning those layers to leave the stack structures shown in FIG. 1. In one embodiment, the layers are patterned by forming a patterned photo resist structure over the layers (not shown) and etching the layers with an etchant or etchants having the appropriate etch chemistries.

Figure 2:
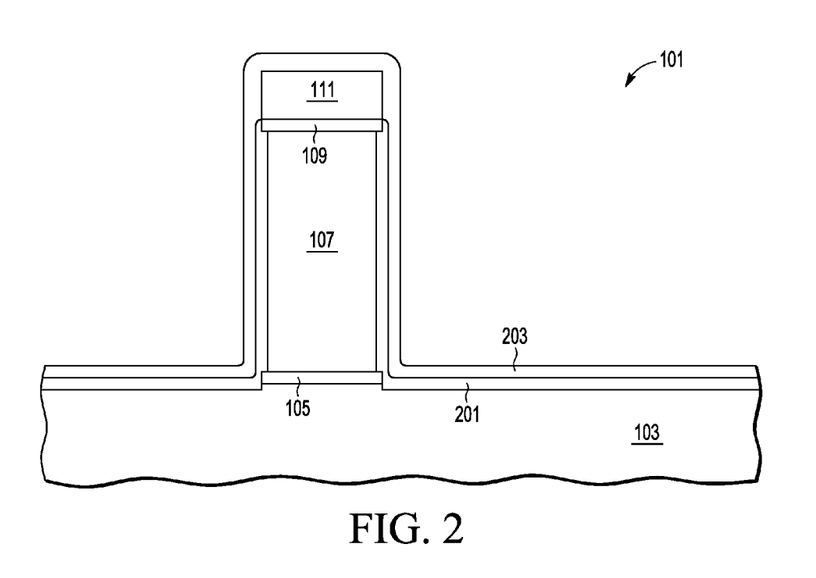

FIG. 2 shows a stage of wafer 101 after the formation of a dielectric layer 201 and an oxidizable layer 203. In one embodiment, layer 201 is made of silicon oxide and is formed by oxidizing gate 107 and substrate 103. Exposed silicon portions of gate 107 and substrate 103 are consumed in the oxidation process to make layer 201. Layer 201 has a thickness controlled by the parameters of the oxidation process (e.g. time, temp, etc). In one embodiment, the thickness of layer 201 is in the range of 30-100 A, but may be of other thicknesses in other embodiments. In other embodiments, layer 201 may be formed through thermal oxidation or deposition e.g. by furnace and RTA or chemical vapor deposition.

A layer 203 of oxidizable material is formed on layer 201 over gate 107 and substrate 103 and along the sidewalls of gate 107. In one embodiment, layer 203 is a made of amorphous silicon, but may be made of other oxidizable materials in other embodiments (e.g. poly silicon). In one embodiment, layer 203 has a thickness in the range of 15-100 A but may be of other thicknesses in other embodiments. In one embodiment, utilizing amorphous silicon may provide for better control of the thickness of the relatively thin layer 203.

Figure 3:
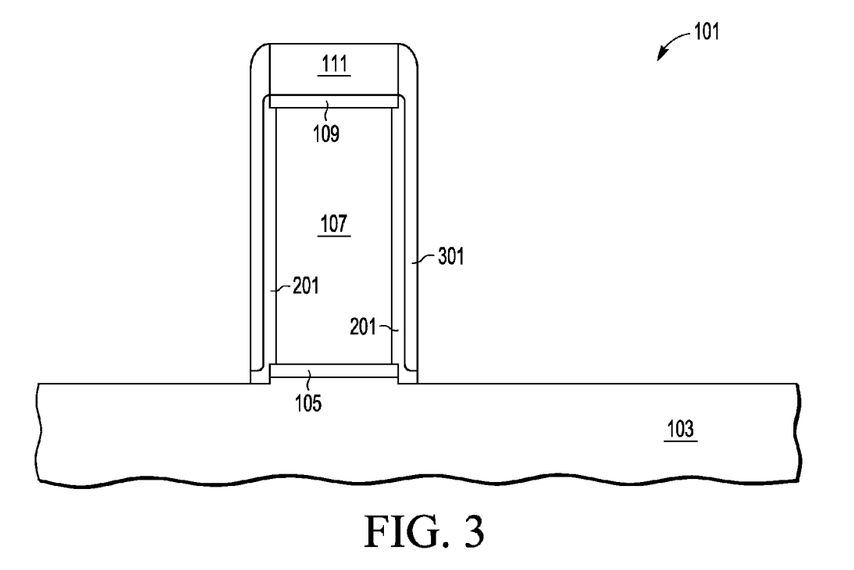

FIG. 3 shows wafer 101 at another manufacturing stage where layer 203 is anisotropically etched to form spacer 301. In one embodiment, layer 203 is etched with an etchant that is selective to the oxidizable material of layer 203 and is selective with respect to the material of layer 201. In one embodiment, an etchant of chlorine, fluorine, and/or bromine-based chemicals is used to remove portions of layer 203. Layer 201 serves as an etch stop during the anisotropic etching of layer 203.

After layer 203 is etched, layer 201 is etched with an etchant that is selective to the material of layer 201 and is selective with respect to the material of spacer 301 to remove the exposed portions of layer 201 and to clean substrate 103. In one embodiment, the isotropic etching is performed using an HF etchant.

Figure 4:
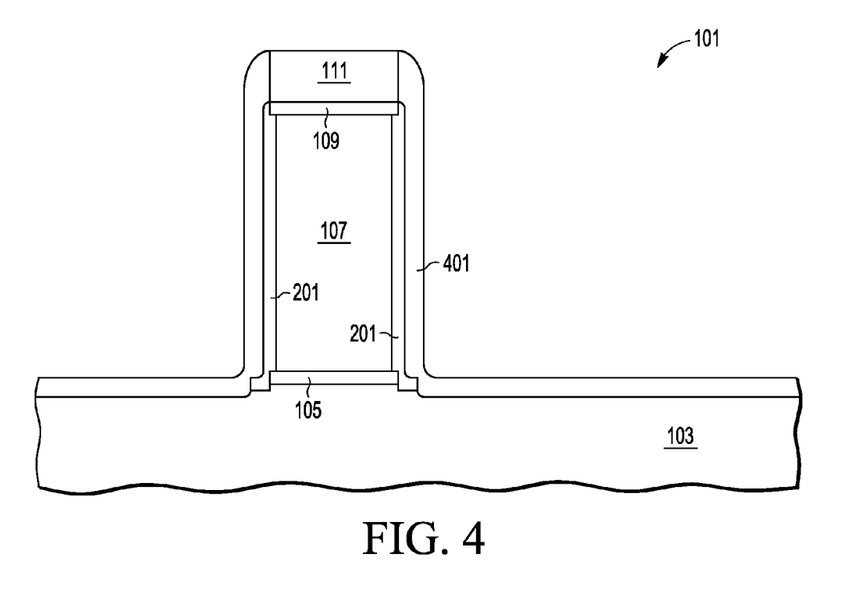

FIG. 4 shows wafer 101 after the wafer is subject to an oxidation process where spacer 301 is oxidized and exposed surfaces of substrate 103 are oxidized to form an oxide layer 401. In one embodiment, layer 401 along the sidewall has a thickness in the range of 40-80 A, but may have other thickness in other embodiments. In one embodiment, the thickness of the portion of layer 401 along the side wall of gate 107 is dependent upon the thickness of spacer 301. Preferably, in some embodiments, the oxidation process is performed for a period of time that is just long enough to oxidize all of spacer 301.

During the oxidation process, a portion of the substrate 103 is oxidized as well to form the portion of layer 401 located on substrate 103. In some embodiments, this portion of layer 401 serves a tunnel dielectric. In other embodiments, an additional dielectric layer may be formed on layer 401 which also would serve as a tunnel dielectric. In some embodiments, layer 401 may be anisotropically etched to reduce the thickness of the portion of layer 401 located on substrate 103.

Figure 5:
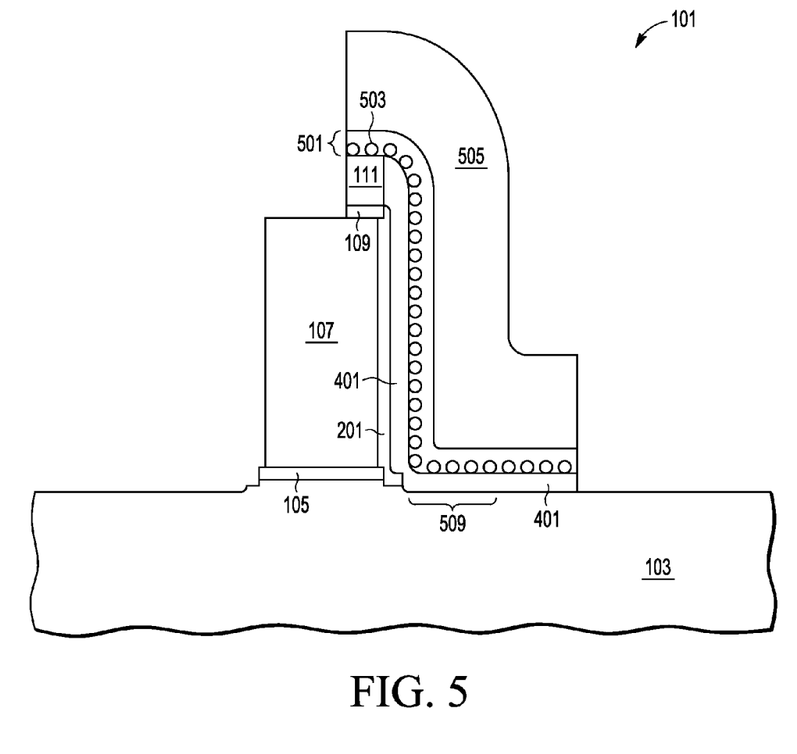

FIG. 5 is a partial side cutaway view of wafer 101 after a charge storage layer 501 and control gate 505 are formed over wafer 101 and patterned to leave the structure shown in FIG. 5. The embodiment shown, layer 501 includes a number of spaced apart discrete charge storage elements 503. In one embodiment, the discrete charge storage elements 503 are made of silicon nanocrystals, but may be made of other types of material such as metal nanoclusters, silicide nanoclusters, or germanium nanocrystals. The discrete charge storage elements 503 are isolated structures that can be programmed to store charge to alter the voltage threshold of the memory cell during a read operation. Accordingly, the value read from the cell during a read operation will depend upon whether the cell is programmed. In the embodiment shown, the discrete charge storage structures that most affect the voltage threshold of the memory cell are located in area 509.

In the embodiment shown, the elements 503 are formed on layer 401 and on ARC structure 111. In one example, silicon nanocrystals can be formed by forming a thin layer of silicon over wafer 101 and then annealing the wafer to form the discrete elements. In some embodiments, an additional layer of silicon is formed over the nanocrystals and then annealed to increase the thickness of the nanocrystals. However, elements 503 can be formed by other methods in other embodiments.

After the formation of discrete elements 503, another layer of dielectric material (e.g. silicon oxide) is formed over wafer 101 to cover the discrete elements. In one embodiment, this dielectric layer has a thickness of 140 A, but it may be of other thicknesses in other embodiments. This top layer is shown in FIG. 5 as being part of layer 501.

After layer 501 has been formed, a layer of gate material (e.g. polysilicon) is formed over wafer 101. In one embodiment, the layer of gate material is 1000 A thick, but may be of other thicknesses in other embodiments. Afterwards, the layer of gate material is patterned to form control gate 505. When the control gate layer is patterned, layer 501, structure 111, structure 109, layer 401, and layer 201 are also patterned with the appropriate etch chemistries to leave the structures shown in FIG. 5.

In the embodiment shown, the portion of layer 401 located on substrate 103 is used as a tunnel oxide for the memory cell shown in FIG. 5.

Figure 6:
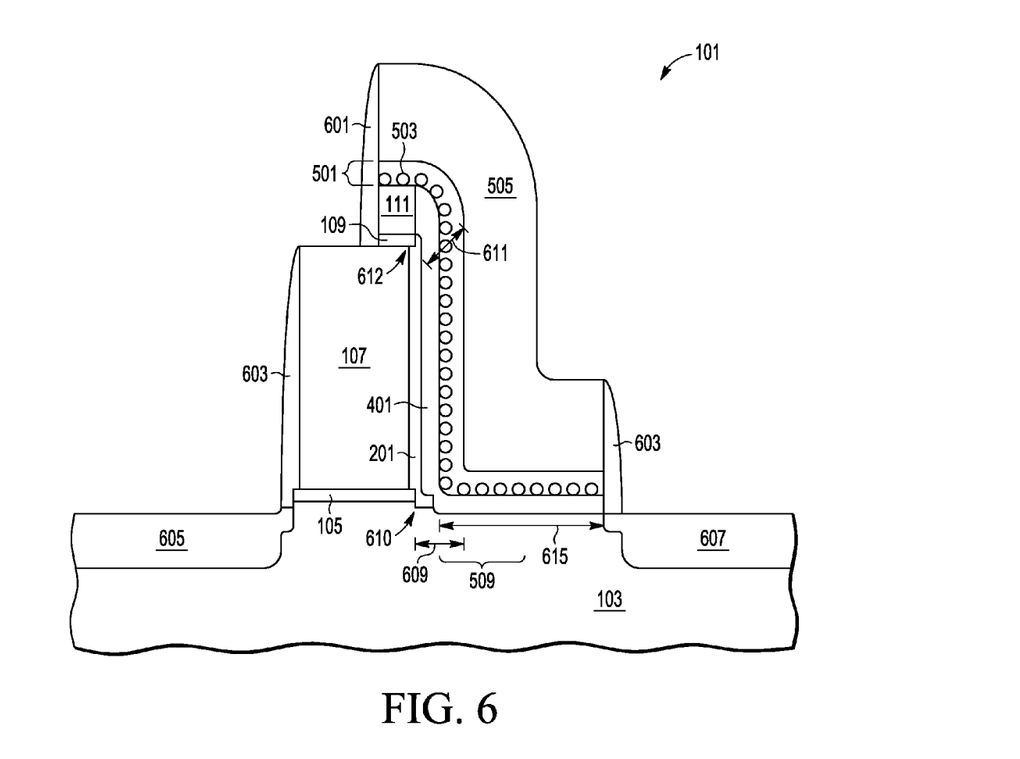

FIG. 6 shows wafer 101 after dielectric spacers 601 and 603 are formed on wafer 101 and after source region 607 and drain region 605 are formed in substrate 103. In one embodiment, spacers 601 and 603 are made of a nitride that is formed over wafer 101 and anisotropically etched to form the spacer structures. Source region 607 and drain region 605 are formed by implanting those regions with conductivity dopants (e.g. boron, arsenic, phosphorous, indium) that are of an opposite conductivity as the dopants in substrate 103. In some embodiments, the source and drain regions include lightly doped extension regions that are implanted prior to the formation of spacer 603. After spacer 603 is formed, a heavy dosage of the impurities are implanted into regions 605 and 607. Afterwards the dopants are annealed to activate.

FIG. 6 shows a split gate memory cell having a select gate 107, a control gate 505, a source region 607, a drain region 605, and a charge storage structure (the discrete charge storage elements 503). In other embodiments, other types of charge storage structures (e.g. a floating gate) can be used. The spilt gate memory cell includes a tunnel region 615 which is the portion of the substrate 103 under discrete charge storage elements 503. Tunnel region 615 is located laterally adjacent to the select gate 107 and located under a portion of control gate 505. The charge storage structure of the memory cell of FIG. 6 is programmed, erased, and read by applying the appropriate voltages and coupling the appropriate circuitry to the source region 607, drain region 605, control gate 505, select gate 607, and substrate 103.

After the stage of FIG. 6, silicide (not shown) is formed on exposed portions of source region 607, drain region 605, control gate 505, and select gate 107. Contacts and interconnect layers embedded in dielectric material are then formed over wafer 101 to interconnect the structures of the memory cells to structures of other circuitry. For example, drain region 605 may be coupled to a bit line and select gate 107 may be coupled to a word line of a memory array. Afterwards, bond pads and a passivation layer may be formed on wafer 101. Wafer 101 is then singulated into multiple integrated circuits with each integrated circuit including multiple memory cells in an array similar to the memory cell shown in FIG. 6.

In one embodiment, providing a gap spacer (the portion of layer 201 and 401 along the sidewall of gate 107) to increase the thickness between select gate 107 and control gate 505 acts to improve the reliability of the cell by increasing the breakdown voltage between the control gate and select gate. For example, a high electric field may be present at the location shown by line 611 due to the proximately of select gate corner 612. Providing this gap spacer acts to reduce the high field at that location. Also, at location 610 of substrate 103, a high peak electric field may cause band to band generation of electrons which can cause program disturb of an erased bit cell. Increasing the gap dielectric thickness (e.g. with layer 401 and 201) decreases the peak electric field in the gap (609) between the select gate and control gate in the substrate 103.

Referring back to FIG. 1, in another embodiment, gate 107 may be defined in different patterning processes. For example, in FIG. 1, the layer of gate material would be patterned first to form the right sidewall of gate 107 shown in FIG. 1. The left sidewall of gate 107 would be formed after the formation of the charge storage layer 501 and the layer of control gate material for gate 505.

Figure 7:
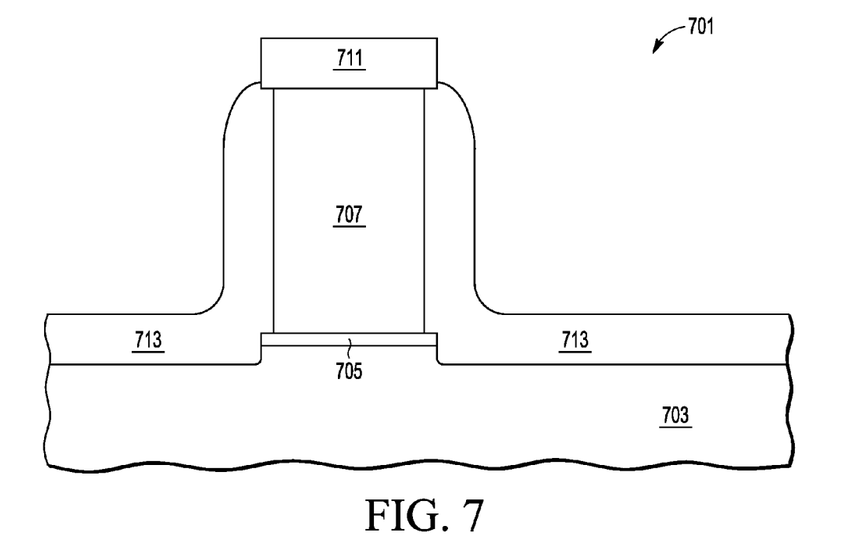
FIGS. 7-9 set forth partial cutaway side views of a memory cell at various stages in its manufacture according to another embodiment of the present invention.
Figure 8:
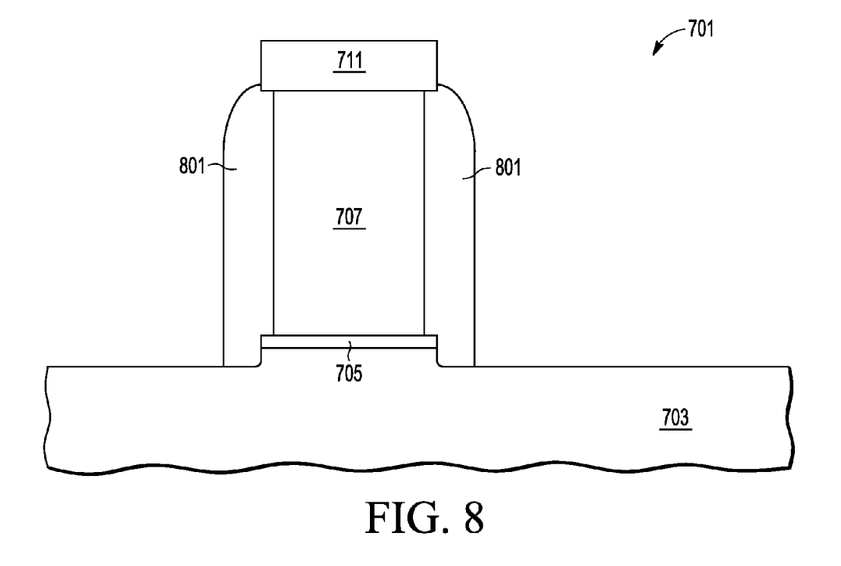
Figure 9:
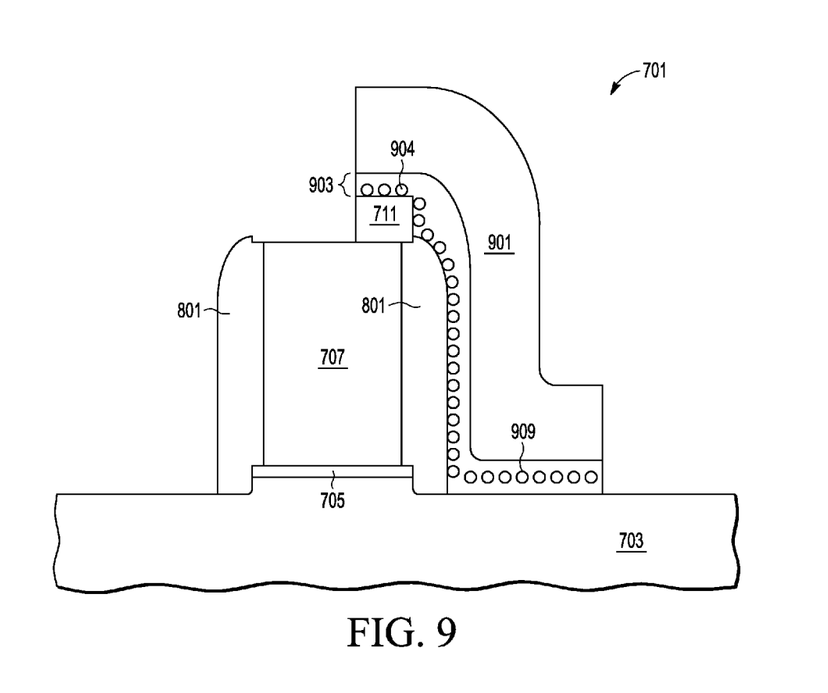

FIGS. 7-9 set forth partial cutaway side views of a wafer 701 at various stages in the manufacture of a spilt gate memory cell with a gap spacer according to another embodiment of the present invention.

FIG. 7 shows a partial side view of wafer 701 after the formation of a gate 707 located over substrate 703. Located on gate 707 is a structure of antireflective coating 711. Gate 707 is located on dielectric 705. Gate 707, dielectric 705, substrate 703, and structure 711, may be made of similar material and/or formed in a similar manner as that set forth above with respect to gate 107, dielectric 105, substrate 103, and structure 111.

A dielectric layer 713 is formed on wafer 701. In one embodiment, layer 713 is formed by an oxidation process, but may be formed by a deposition process in other embodiments. In one embodiment, layer 713 is at least 30 A thick and preferably between 100 A and 200 A thick. During the oxidation process, a portion of the side walls of gate 707 and the exposed surface of substrate 703 are oxidized. In some embodiments, layer 713 would be deposited on wafer 701 and may be formed of dielectric materials such as silicon oxide, high K dielectrics (e.g. hafnium oxide), or a nitride.

FIG. 8 shows wafer 701 after a portion of layer 713 has been removed to form gap spacer 801. In one embodiment, layer 713 is anisotroically etched where etching is stopped when the etchant reaches silicon of substrate 103. Wafer 701 is then annealed to reduce plasma induced damage to the exposed portion of substrate 703 from the anisotropic etch. In another embodiment, the anisotropic etch is a timed etch designed to leave approximately 10-30 A of oxide of layer 713 on substrate 703. Wafer 701 is then subjected to an isotropic HF wet etch to remove the remaining portion of the oxide on substrate 703.

FIG. 9 shows wafer 701 after a layer 903 of charge storage material is formed on wafer 101 and a control gate 901 is formed from a layer of gate material. In the embodiment shown, layer 903 is formed by forming a tunnel dielectric layer on the tunnel region of substrate 703 having a thickness in a range of e.g. 40-80 A. In one embodiment, the tunnel dielectric layer is formed by oxidizing exposed portions of substrate 703. During the oxidation process, the thickness of spacer 801 is increased due to the oxidation of gate 707. In other embodiments, the tunnel dielectric layer maybe formed by other processes (e.g. deposition) and be of other materials (e.g. a high K dielectric such as hafnium oxide). Afterwards, discrete charge storage elements (e.g. silicon nanocrystals) are formed on the tunnel dielectric, spacer 801, and structure 711. Afterwards, another dielectric layer (e.g. a high temperature oxide) is formed on the discrete charge storage elements 904 and exposed portion of the tunnel dielectric to complete charge storage layer 903.

Afterwards, a layer of control gate material is formed on the charge storage layer 903, wherein the charge storage layer, the select gate material layer, and structure 711 are patterned to form the structure as shown in FIG. 9. Afterwards, wafer 701 may be further processed as described above with respect to wafer 101.

As with layers 201 and 401 located along the side wall of gate 107, spacer 801 on the side wall of gate 707 acts to increase the distance between the control gate 901 and select gate 707. As described above, this acts to improve the reliability of the cell by increasing the breakdown voltage between the control gate and select gate as well as decreasing program disturb of an erased bit cell.

Referring back to FIG. 4, because layer 401 (and spacer 801 in some embodiments) is formed by an oxidation of an oxidizable material, it is of a higher quality than a layer formed by a deposition process. Furthermore, because layer 401 is formed by an oxidation of a spacer of oxidizable material, it extends higher up the gate stack (e.g. almost to the top of structure 111) as opposed to a spacer formed from an oxidized layer formed on the side wall of the select gate (e.g. see FIG. 8 where spacer 801 does not extend as high up structure 711 as layer 401 extends up on structure 111). Accordingly, forming a gap spacer by oxidizing a spacer of oxidizable material may in some embodiments, allow for the gap spacer to extend higher up the side wall of a control gate to provide for more separation from the top corner of the select gate to the control gate. Furthermore, in some embodiments, forming the spacer by an oxidizing process allows for a gap spacer to be formed without the use of a nitride layer which allows for easier removable of unwanted spacer material. However, some embodiments may use a nitride material.

As used herein a layer located along a sidewall includes where a layer is formed directly on the sidewall, the layer is formed directly on an intermediate layer that is formed on directly on the side wall, or there are one or more intermediate layers formed along the side wall are located between the layer and the layer formed directly on the sidewall. For example, a layer may be located along a side wall if it is formed directly on the side wall or if one or more layers are located between the layer and the sidewall.

In one embodiment, a method for forming a split gate device includes forming a first dielectric layer over a semiconductor layer, forming a first conductive gate layer over the first dielectric layer, and forming a first sidewall of the first conductive gate layer. The semiconductor layer includes a tunnel region which is laterally adjacent the first sidewall of the first conductive gate layer. The method includes forming a second dielectric layer along the first sidewall of the first conductive gate layer and over the tunnel region of the semiconductor layer and removing a first portion of the second dielectric layer from over the tunnel region. A second portion of the second dielectric layer remains along the first sidewall of the first conductive gate layer. The method includes after the removing the first portion, forming a third dielectric layer over the tunnel region. The method also includes after forming the third dielectric layer, forming a charge storage layer over a portion of a top surface of the first conductive gate layer. The charge storage layer is located along the first sidewall of the first conductive gate layer and over the tunnel region of the semiconductor layer. The method includes forming a second conductive gate layer over the charge storage layer. The second conductive gate layer is formed over the portion of the top surface of the first conductive gate layer, along the first sidewall of the first conductive gate layer, and over the tunnel region of the semiconductor layer.

In one embodiment, a method for forming a split gate device includes forming a first dielectric layer over a semiconductor layer, forming a first conductive gate layer over the first dielectric layer, and forming a first sidewall of the first conductive gate layer. The semiconductor layer includes a tunnel region which is laterally adjacent the first sidewall of the first conductive gate layer. The method includes forming second dielectric layer along the first sidewall of the first conductive gate layer, forming an oxidizable layer over the first conductive gate layer and the second dielectric layer. Along the first sidewall of the first conductive gate layer, the second dielectric layer is between the first conductive gate layer and the oxidizable layer. The method includes removing a portion of the oxidizable layer from over the tunnel region of the semiconductor layer, oxidizing the oxidizable layer to form an oxide layer along the first sidewall of the first conductive gate layer, and forming a charge storage layer over a portion of a top surface of the first conductive gate layer and over the oxide layer. The charge storage layer is located along the first sidewall of the first conductive gate layer and over the tunnel region of the semiconductor layer. The method also includes forming a second conductive gate layer over the charge storage layer. The second conductive gate layer is formed over the portion of the top surface of the first conductive gate layer, along the first sidewall of the first conductive gate layer, and over the tunnel region of the semiconductor layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a split gate device, the method comprising:
    forming a first dielectric layer over a semiconductor layer;
    forming a first conductive gate layer over the first dielectric layer;
    forming a first sidewall of the first conductive gate layer, wherein the semiconductor layer includes a tunnel region which is laterally adjacent the first sidewall of the first conductive gate layer;
    forming second dielectric layer along the first sidewall of the first conductive gate layer;
    forming an oxidizable layer over the first conductive gate layer and the second dielectric layer, wherein, along the first sidewall of the first conductive gate layer, the second dielectric layer is between the first conductive gate layer and the oxidizable layer;
    removing a portion of the oxidizable layer from over the tunnel region of the semiconductor layer;
    oxidizing the oxidizable layer to form an oxide layer along the first sidewall of the first conductive gate layer;
    forming a charge storage layer over a portion of a top surface of the first conductive gate layer and over the oxide layer, wherein the charge storage layer is located along the first sidewall of the first conductive gate layer and over the tunnel region of the semiconductor layer; and
    forming a second conductive gate layer over the charge storage layer, wherein the second conductive gate layer is formed over the portion of the top surface of the first conductive gate layer, along the first sidewall of the first conductive gate layer, and over the tunnel region of the semiconductor layer.

2. The method of claim 1, wherein the removing the portion of the oxidizable layer from over the tunnel region of the semiconductor layer comprises:
    performing an anisotropic etch of the oxidizable layer using the second dielectric layer as an etch stop layer.

3. The method of claim 1, wherein the oxidizable layer includes amorphous silicon.

4. The method of claim 1, wherein the oxidizable layer includes silicon.

5. The method of claim 1, wherein the forming the charge storage layer over the portion of the top surface of the first conductive gate layer and over the oxide layer comprises:
    forming discrete charge storage elements over the portion of the top surface of the first conductive gate layer and over the oxide layer, wherein discrete charge storage elements are formed along the first sidewall of the first conductive gate layer and over the tunnel region of the semiconductor layer.

6. The method of claim 1, wherein the first conductive gate layer is further characterized as a select gate layer and the second conductive gate layer is further characterized as a control gate layer.

7. The method of claim 1 wherein:
    the forming the second dielectric layer includes forming the second dielectric layer over the tunnel region of the semiconductor layer;
    the method further comprises removing a portion of the second dielectric layer from over the tunnel region of the semiconductor layer after the removing a portion of the oxidizable layer from over the tunnel region.

8. The method of claim 7, wherein the removing a portion of the second dielectric layer comprises:
    performing an isotropic etch to remove the first portion of the second dielectric layer which remains exposed after removing the portion of the oxidizable layer.

9. The method of claim 1 further comprising:
    forming a nitride layer over the first conductive gate layer prior to the forming the first sidewall, wherein a portion of the nitride layer remains between the charge storage layer and the first conductive gate layer.

10. The method of claim 1 further comprising:
    wherein oxidizing the oxidizable material further includes, forming a tunnel oxide layer over the tunnel region, wherein the tunnel oxide layer serves as a tunnel dielectric.

11. The method of claim 1 further comprising:
    wherein oxidizing the oxidizable material further includes, forming a tunnel oxide layer over the tunnel region, wherein the charge storage layer is formed over the tunnel oxide layer.

12. The method of claim 11 wherein the forming the charge storage layer includes forming discrete charge storage elements on the tunnel oxide layer.

13. The method of claim 11 wherein the forming the tunnel oxide layer further includes oxidizing a portion of the semiconductor layer currently with the oxidizing the oxidizable layer.

14. The method of claim 13, wherein the oxidizable layer includes amorphous silicon.

15. The method of claim 13, wherein the oxidizable layer includes silicon.

16. The method of claim 13 wherein the forming the charge storage layer includes forming discrete charge storage elements on the tunnel oxide layer.

17. The method of claim 16 wherein the tunnel oxide layer serves as a tunnel dielectric.

18. The method of claim 11, wherein the oxidizable layer includes amorphous silicon.

19. The method of claim 11, wherein the oxidizable layer includes silicon.

20. The method of claim 11 wherein the tunnel oxide layer serves as a tunnel dielectric.

* * * * *